US006396313B1

(12) United States Patent
Sheen

(10) Patent No.: US 6,396,313 B1
(45) Date of Patent: May 28, 2002

(54) NOISE-SHAPED DIGITAL FREQUENCY SYNTHESIS

(75) Inventor: Timothy W. Sheen, Brighton, MA (US)

(73) Assignee: Teradyne, Inc., Boston, MA (US)

( * ) Notice: Subject to any disclaimer, the term of this patent is extended or adjusted under 35 U.S.C. 154(b) by 74 days.

(21) Appl. No.: 09/645,367

(22) Filed: Aug. 24, 2000

(51) Int. Cl.$^{7}$ ................................................ H03B 21/00

(52) U.S. Cl. ....................... 327/105; 327/551; 327/100; 327/276

(58) Field of Search ................................ 327/105, 107, 327/100, 291, 552, 270, 276, 551; 341/200

(56) References Cited

U.S. PATENT DOCUMENTS 5,396,248 A * 3/1995 Miyazaki et al. ........... 341/200
5,508,647 A * 4/1996 Okamoto .................... 327/167
5,512,895 A 4/1996 Madden et al. ............... 341/61
5,566,188 A 10/1996 Robbins et al. ............... 371/27
5,619,202 A 4/1997 Wilson, Jr. et al. ......... 341/143
RE36,063 E 1/1999 Conner ....................... 395/550
5,892,468 A 4/1999 Wilson et al. ................ 341/61
5,905,967 A 5/1999 Botham ...................... 702/118
6,252,464 B1 * 7/2001 Richards et al. ............ 327/107

* cited by examiner

*Primary Examiner*—Dinh T. Le
(74) *Attorney, Agent, or Firm*—Bruce D. Rubenstein

(57) ABSTRACT

A clock generator for automatic test equipment employs an improved technique for generating clock signals from a reference clock. To generate a desired clock signal, a clock generator produces a time-quantized signal having a period equal to an integer number of reference clock periods and equal to the desired clock period, plus or minus a quantization error. For each cycle of the desired clock signal, a noise-shaping requantizer processes the quantization error to generate noise-shaping signals. The noise-shaping signals then establish delay values of a variable pipeline delay. The variable pipeline delay adjusts each period of the time-quantized signal by an integer number of reference clock cycles, based upon the noise-shaped signals. The effect of noise shaping the quantization error and selectively delaying the time-quantized signal is to shift jitter in the time-quantized signal from relatively low frequencies to relatively high frequencies. A phase-locked loop can then be used to filter the remaining high-frequency jitter.

20 Claims, 2 Drawing Sheets

NOISE-SHAPED DIGITAL FREQUENCY SYNTHESIS

This application relates generally to automatic test equipment for electronics (ATE), and more particularly to the synthesizing clock signals for use with ATE systems.

BACKGROUND OF THE INVENTION

A need frequently arises in ATE systems for generating accurate, low-jitter clock signals from a reference clock. If the desired clock frequency is an integer quotient of the reference clock frequency, a simple frequency divider such as a counter can be used. Similarly, if the desired frequency is an integer multiple of the reference clock frequency, a frequency multiplier can be used. The frequency multiplier may take the form of a harmonic generator followed by a filter, or—more commonly today—a phase-locked loop with a frequency divider in the feedback path.

Frequency division and multiplication are often combined in a single system, providing signals that bear an N/M relationship to the reference clock frequency. The performance of these systems tends to degrade, however, when N and M become large. Limiting N and M to smaller values sacrifices frequency resolution.

An alternative approach called Direct Digital Synthesis ("DDS") provides arbitrarily high frequency resolution, but at the expense of increased complexity. FIG. 1 illustrates a conventional DDS for generating clock signals. A phase accumulator 114 is made to increment once per cycle of a reference clock. The size of each increment of the phase accumulator 114 is represented by the output of divider 110. This value equals the full-scale value of the phase accumulator 114 (nominally 1) times the frequency of the desired output clock, divided by the frequency of the reference clock. For example, assuming a 100 MHz reference clock, the value at the output of the divider 110 would nominally equal 1/100 to generate a 1 MHz output clock. The phase accumulator 114 would then be made to increment by steps of 1/100 upon each cycle of the reference clock.

This action of incrementing the phase accumulator 114 causes it to reach its full-scale value and "roll over" once per period of the desired output clock. The values stored in the phase accumulator 114 thus represent relative phase of the desired output clock, with zero to full-scale representing 0 to $2\pi$ radians. Upon each cycle of the reference clock, a look-up table 116 converts the phase stored in the phase accumulator 114 into a digital representation of the desired output waveform (generally the sine of the phase at that instant). A digital-to-analog converter 118 then converts the digital representation into voltage, and a filter removes artifacts from the output signal.

The performance of a DDS is generally limited by the number of entries in the look-up table 116 and the resolution of the digital-to-analog converter 118. Often, simple filters are insufficient to remove conversion artifacts, and it is necessary to add a phase-locked loop 120 at the output of the converter. The resulting implementation tends to be complex and expensive, as those skilled in the art are well aware.

Another alternative for generating clock signals is disclosed in U.S. Pat. No. 5,274,796, assigned to Teradyne, Inc., of Boston, MA. In that patent, a timing generator is disclosed that produces clock signals for which each cycle is composed of an integer number of reference clock cycles, plus a non-integer delay. An interpolator supplies the non-integer delay in response to a digitally derived "residue" signal on a cycle-by-cycle basis, to correct for errors due to missing fractional portions of a reference clock cycle. Although accurate, the interpolator technique tends to be expensive, due to the high cost of the interpolators themselves.

SUMMARY OF THE INVENTION

With the foregoing background in mind, it is an object of the invention to generate clock signals from a reference clock more economically than can be done using conventional techniques.

To achieve this object and other objectives and advantages, a clock generator produces a time-quantized signal having a period equal to the period of a desired clock signal to within a quantization error. A noise-shaping requantizer processes the quantization error on a cycle-by-cycle basis to generate noise-shaped values, and a variable pipeline delay selectively delays the time-quantized signal by an integer number of reference clock periods, based upon the noise-shaped values. The effect of noise shaping the quantization error and selectively delaying the time-quantized signal in response to the noise shaped values is to shift jitter in the time-quantized signal from relatively low frequencies to relatively high frequencies. A phase-locked loop can then be used to filter the remaining high-frequency jitter.

BRIEF DESCRIPTION OF THE DRAWINGS

Additional objects, advantages and novel features of the invention will become apparent from a consideration of the ensuing description and the drawings, in which.

DETAILED DESCRIPTION OF THE INVENTION

Structure

Figure 1:
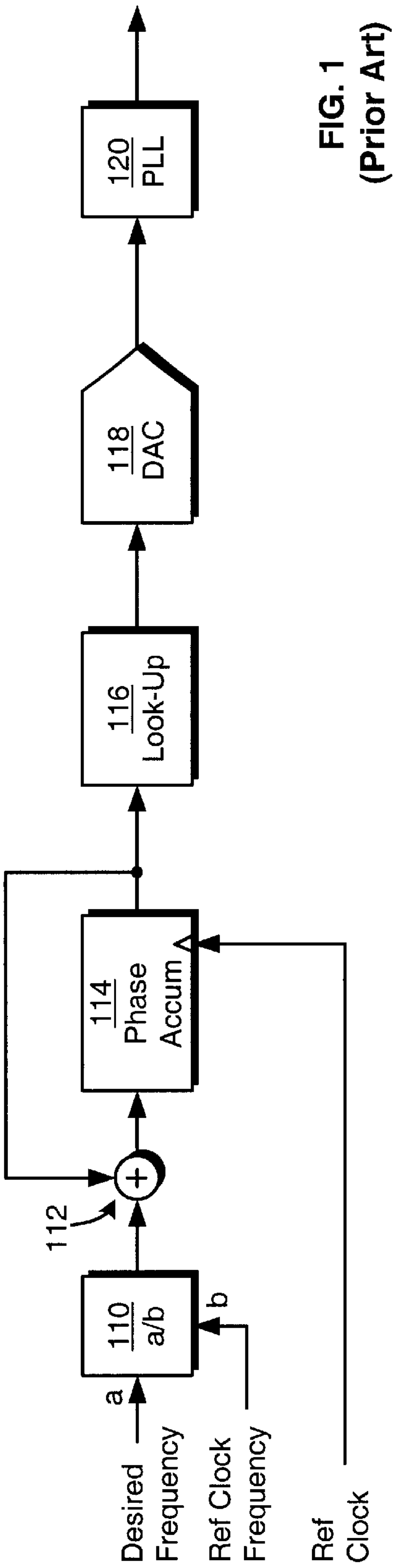
FIG. 1 is a simplified block diagram of a frequency synthesizer that operates using conventional techniques of direct digital synthesis.
Figure 2:
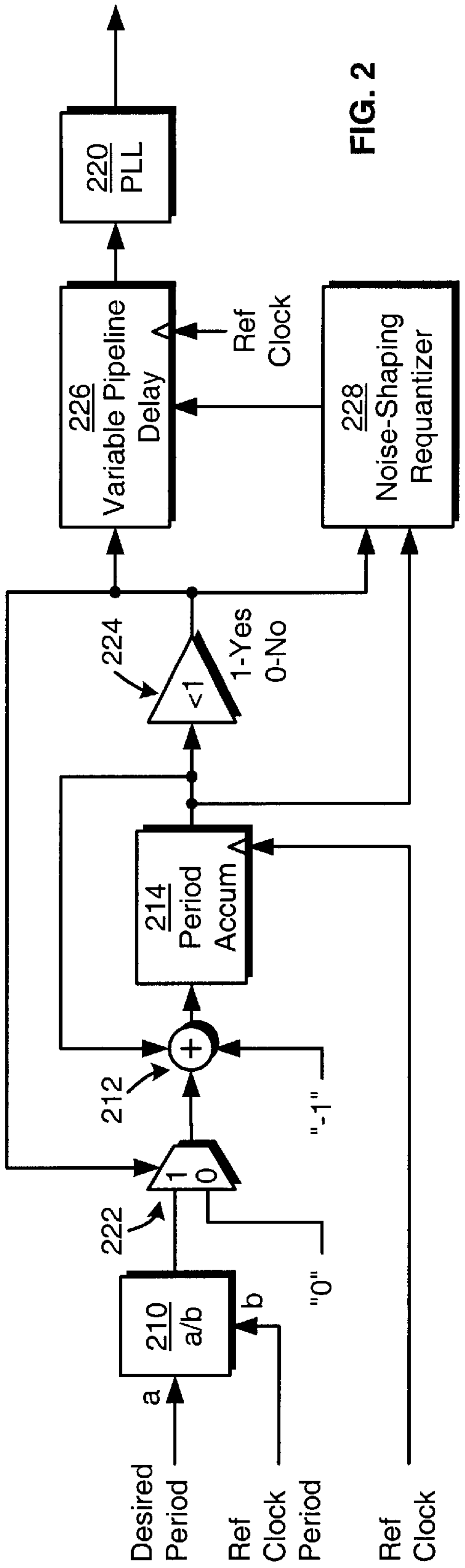
FIG. 2 is a simplified block diagram of a clock generator according to the invention.

FIG. 2 is a simplified block diagram of a clock generator 200 in accordance with the invention. It can immediately be seen that the clock generator 200 bears a superficial resemblance to the DDS topology of FIG. 1. For example, the clock generator 200 includes a period accumulator 214 that is similar to the phase accumulator 114 of FIG. 1. The clock generator 200 also includes a divider 210 and a phase locked loop 220 that are similar to the divider 110 and phase locked 120 of FIG. 1.

Compared with the phase accumulator 114 of FIG. 1, however, the period accumulator 214 never reaches its full-scale value during normal operation, and thus does not automatically roll over. Instead, the period accumulator 214 is decremented upon each cycle of reference clock. It is also incremented whenever its contents become less than one. The contents of the period accumulator are thus caused to oscillate between values that are greater than zero and less than full-scale.

The oscillation is established by the action of an underflow detector 224, a summer 212, a divider 210, and a multiplexor 222, which act in concert with the period accumulator 214. The underflow detector 224 is coupled to the output of the period accumulator 214 and monitors its contents. When the contents of the period accumulator 214 are less than one, the underflow detector 224 asserts an underflow signal. When the contents are greater than or equal to one, the underflow detector 224 de-asserts the underflow signal.

As shown in FIG. 2, the underflow signal controls a SELECT input of the multiplexor 222, which receives two inputs and provides one output. The first input of the multiplexor 222 is coupled to the output of the divider 210, and the second input receives a fixed level "0." The divider 210 produces at its output the quotient of its two inputs, i.e., the desired period divided by the reference clock period. This quotient equals, to the numerical precision of the divider, the number of reference clock periods in each desired output period. As the underflow signal is asserted and de-asserted, the quotient and the value "0" are respectively summed into the period accumulator 214 by the summer 212. The summer 212 also sums into the period accumulator 214 a value of "−1," to decrement the contents of the period accumulator 214 on every reference clock cycle.

Owing to this structure, the underflow signal is caused to oscillate with a period that precisely equals the desired period input to the divider 210. Although this period is precisely correct on the average over time, any individual cycle of the underflow signal has an error of up to one period of the reference clock. The underflow signal can thus be regarded as a time-quantized version of the desired clock signal, which suffers from a quantization error of up to one reference clock period.

Those skilled in the art of data conversion have for many years used a technique called "noise shaping" to requantize relatively high-resolution digital signals into relatively low-resolution signals, without sacrificing signal fidelity. For example, noise-shaping has been used to map signals represented by 16-bit values into 12-bit values. Without the benefits of noise shaping, the 16-bit values would simply be truncated to fit within the available bins of 12-bit values, and the resulting truncation errors, which constitute fractions of an LSB, would simply be ignored. Through noise shaping, the truncation errors are stored, and then added to or subtracted from other samples. The net effect of noise shaping is to redistribute the noise spectrum of the requantized signal from a relatively flat characteristic to one that has greatly decreased noise at lower frequencies and increased noise at higher frequencies. The high-frequency noise can generally be eliminated by inexpensive low-pass filters, leaving signals with much lower noise than could be provided without noise shaping.

A significant advance of the instant invention is to apply noise-shaping techniques to the timing of signals, whereas they have previously been applied primarily to the levels of signals. Instead of shifting the spectrum of voltage-level noise, as is conventionally done, the instant invention shifts the spectrum of jitter.

Continuing with reference to FIG. 2, the underflow signal from the underflow detector 224 is provided to the input of a variable pipeline delay 226. The variable pipeline delay 226 delays the passage of the underflow signal by an integer number of reference clock periods. Significantly, a noise-shaping requantizer 228 establishes the number of reference clock periods in this delay.

Figure 3:
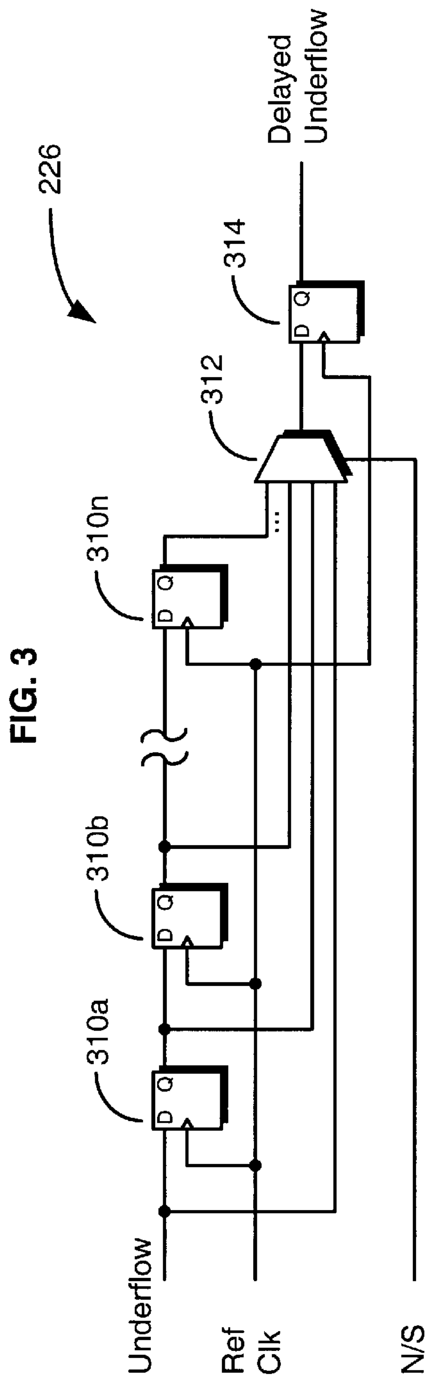
FIG. 3 is a detailed block diagram of a variable pipeline delay for use with the clock generator of FIG. 2.

As shown in FIG. 3, the noise-shaping requantizer 228 has a data input coupled to the period accumulator 214, for receiving its contents, and a clock input coupled to the output of the underflow detector 224, for receiving the underflow signal. Each time the underflow signal is asserted, the noise-shaping requantizer produces new output values. These output values establish the amount of delay of the variable pipeline delay 226.

The output of the variable pipeline delay 226 represents the underflow signal noise shaped at a "new" resolution—the period of the reference clock. Although each period of the noise-shaped underflow signal equals an integer number of reference clock periods (as does the underflow signal before noise shaping), its errors are reshaped so that they occur predominantly at high frequencies. With the spectral errors shifted from lower to higher frequencies, the remaining high-frequency noise (jitter) can be easily removed by the phase-locked loop 220. The signal at the output of the phase-locked loop thus has very low jitter and precisely controlled frequency.

Detailed Topology

Variable Pipeline Delay

FIG. 3 shows an example of the variable pipeline delay 226 that is suitable for use with the clock generator 200 of FIG. 2. As shown in FIG. 3, the variable pipeline delay 226 includes a plurality of one-bit D flip-flops **310*a*–310*n* cascaded in series and commonly clocked by the reference clock. The underflow signal is provided to the D-input of the first D flip-flop 310*a*. The value of the underflow signal is passed from the output of one flip-flop to the output of the next, once per cycle of the reference clock. The behavior of the flip-flops 310*a*–310*n*** thus resembles that of a shift register.

The underflow signal and the output of each D flip-flop are coupled to respective inputs of a multiplexor 312. One of these inputs is selected at a time for passage to the output of the multiplexor 312, in response to a select signal "N/S." The select signal N/S is generated by the noise-shaping requantizer 228. Based upon the input selected, the output of the multiplexor 312 is either the underflow signal directly or a version of the underflow signal that is delayed by an integer number of reference clock cycles. The value of delay thus varies from 0 to n reference clock cycles, where n is the number of flip-flops **310*a*–310*n***.

Because the flip-flops **310*a*–310*n* and the multiplexor 312 have inherent propagation delays, the output signal from the multiplexor 312 is typically not aligned with the reference clock. Preferably, therefore, an additional flip-flop 314 is provided at the output of the multiplexor 312, to realign the output of the multiplexor 312 with the active edge of the reference clock. Although the flip-flop 314 adds one reference period of delay to the output of the variable pipeline delay 226, the delay does not affect the period of the delayed output signal (labeled "Delayed Underflow"). The delay imposed by the flip-flop 314** merely adds a constant phase shift.

The order of the noise-shaping requantizer 228 determines the minimum number of flip-flops **310*a*–310*n* in the variable pipeline delay 226. As is known, a third order noise-shaper provides eight different adjustment values (described below). The variable pipeline delay 226 would thus need at least seven D flip-flops 310*a*–310*n* to provide a total of eight different choices of delay (one from each of the flip-flops' outputs, plus one for the underflow signal directly). The multiplexor 312 would then require at least eight inputs. If only second order noise-shaping is desired, the noise shaper would produce only four adjustment values, and only three flip-flops 310*a*–310*n*** would be needed.

Noise-Shaping Requantizer

Figure 4:
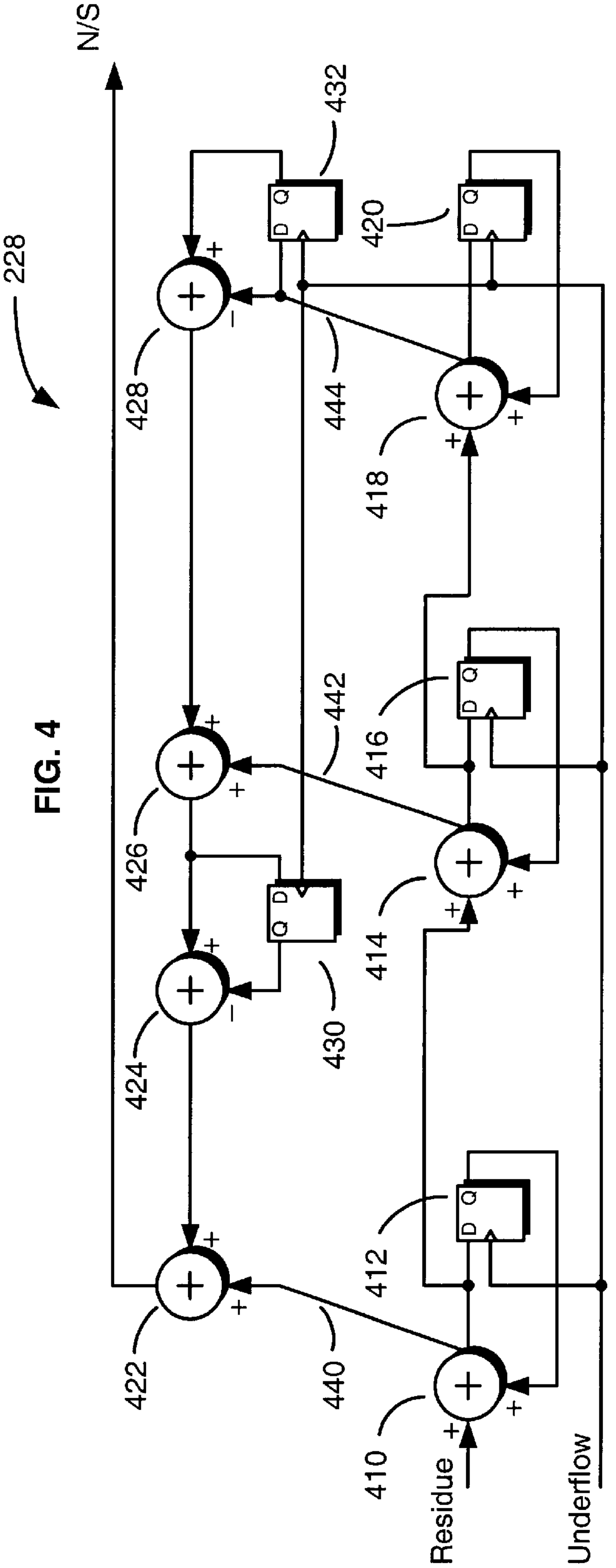
FIG. 4 is a detailed block diagram of a noise-shaping requantizer for use with the clock generator of FIG. 2.

FIG. 4 illustrates a noise-shaping requantizer 228 that is suitable for use with the clock generator 200. The basic structure of noise-shaping requantizers (also called "noise-shapers") is known to those skilled in the art of data conversion, and the noise-shaping requantizer 228 is constructed in accordance with that well-understood structure.

That being said, conventional noise-shaping requantizers generally operate by first separating an input data stream into a first portion, generally regarded as an "integer" portion, and a second portion, generally regarded as a "fractional" portion. However, because the contents of the period accumulator 214 (labeled "residue") upon which the noise shaper operates are always less than one, only fractional values need be processed. The portions of conventional noise shapers that deal with the integer portion of an input signal are therefore excluded from the noise-shaping requantizer 228, as they are not needed.

As shown in FIG. 4, the noise-shaping requantizer 228 receives two inputs and generates one output. The first input is the residue signal, i.e., the contents of the period accumulator 214. The second input is the underflow signal. The underflow signal effectively acts as a clock for the noise-shaping requantizer 228, causing it to update its state every time the contents of the period accumulator 214 become less than one.

In response to the residue and underflow signals, the noise-shaping requantizer 228 generates an output signal N/S, the range of which varies depending upon the order of the noise-shaping requantizer 228. The noise-shaping requantizer 228 of FIG. 4 is a third-order noise-shaper. As such, it generates eight different output values, which range from −3 to +4.

These values are represented as 3-bit binary numbers, which are preferably provided directly to the select input of the multiplexor 312 of the variable pipeline delay 226. The connections of the multiplexor 312 are arranged so that a value of −3 selects the path with the least delay (the underflow signal directly), and increasing values select paths of increasing delay. A value of +4 selects the output of the $7^{th}$ D flip-flop in the chain 310_a_–310_n_ (not shown). The output N/S of the noise-shaping requantizer 228 thus modulates the delay of the variable pipeline delay 226, in response to the residue values contained within the period accumulator 214, when those values cross below one.

In general, the higher the order of a noise-shaper, the more sharply the noise-shaper transfers noise from lower to higher frequencies. Therefore, higher order noise-shapers are generally preferred. However, higher order noise-shapers take up additional space, and have more complex implementations than lower order noise shapers. Higher order noise shapers also require that the variable pipeline delay 226 have additional flip-flops 310_a_–310_n_, and that the multiplexor 312 have additional inputs. We have found that a good compromise between performance and complexity is to use a third order noise shaper.

Examining the noise shaper structure in more detail, the third order noise-shaping requantizer 228 of FIG. 4 includes a plurality of summers 410, 414, 418, 422, 424, 426, and 428 and a plurality of latches 412, 416, 418, 430, and 444. Each summer adds, with the indicated sign, the values at its two inputs and produces an output signal.

The latches 412, 416, and 420 are constructed to form first, second, and third cascaded accumulators, respectively. The output of each latch is summed with the input of the corresponding summer (summers 410, 414, and 418, respectively) to form a subsequent input to the latch, which is clocked into the latch upon the next assertion of the underflow signal.

Eventually, the output of each summer associated with an accumulator becomes too large for the corresponding latch to accommodate, and an overflow signal is produced. The overflow signals from the first, second, and third accumulators (respectively signals 440, 442, and 444) are stripped away from the outputs of the respective summers and funneled directly to the N/S output. Preferably, only the overflow signals are funneled to the output.

The noise-shaping requantizer 228 also includes "first difference" circuits for processing the overflow signals enroute to the noise shaper's output. Each first difference circuit includes a summer (e.g., 224 or 228) and a latch (e.g., 430 or 432, respectively) for subtracting a previous value (the Q-output of the respective latch) from the current value (the D-input of the respective latch). Summers 422 and 426 are also provided for producing the N/S output signal.

For simplicity, the specific bit widths of signals shown in FIG. 4 have been omitted. The bit widths and specific construction of the summers and latches have also been omitted for clarity. However, the detailed construction of the noise-shaping requantizer 228 is known to those skilled in the art. Those skilled in the art would also realize that the specific topology shown in FIG. 4 can be varied significantly to appear quite different from the topology shown, while effectively accomplishing the same result. Therefore, the topology of FIG. 4 should be regarded as one example of many different noise-shaper topologies that are well known, the specific form of which is not critical to the invention.

Phase-Locked Loop

As stated above, the output of the variable pipeline delay 226 is a delayed underflow signal that has been noise-shaped to improve its low-frequency spectral purity. Because the corrections effected by noise shaping are manifested on a cycle-by-cycle basis, the process of filtering jitter from the delayed underflow signal should preferably be highly sensitive to cycle-to-cycle timing changes. As applied to phase-locked loops, we have found that this means the phase-locked loop should be linear.

Linearity of the phase-locked loop can be achieved by ensuring that the phase-locked loop's phase detector has linear input-to-output behavior. If the phase difference between the delayed underflow signal and the PLL output signal (the two inputs to the phase detector) is doubled, the phase detector's output should also be doubled. If the phase detector is not linear, intermodulation products will be generated that add jitter to the output clock, causing the invention to fail to achieve its full benefit.

For generating clocks having frequencies that approach the reference clock frequency, additional performance advantages can be gained by adding a sample-and-hold to the output of the phase detector. The sample-and-hold should preferably be configured to sample the phase detector's output once per cycle of the output clock, at a fixed phase relative to the output clock's period. This fixed phase preferably corresponds to the zero-crossing of the output clock. The interval around the zero-crossing corresponds to the interval during which noise-shaping of the delayed underflow signal affects the phase detector's output. By sampling during these intervals and holding between them, the sensitivity of the phase-locked loop to noise-shaping can be enhanced.

Implementation

With the exception of the phase-locked loop 220, the clock generator 200 can be implemented entirely with digital hardware. This hardware can take the form of discrete digital devices, or, preferably, part or all of a Field-Programmable Gate Array (FPGA) or Application-Specific Integrated Circuit (ASIC). If a mixed-signal ASIC is used, the entire circuit can be implemented within that one device.

The component cost of the clock generator 200 is negligible, except for the phase-locked loop. Phase-locked loops are widely used in automatic test equipment, however. We believe that the digital circuitry that constitutes the clock generator 200 can be added to existing designs that already use phase-locked loops to provide accurate, low jitter clocks at minimal additional expense.

Using a 100 MD reference clock and a third order noise shaper, it is believed that sub-picosecond jitter is attainable. While maintaining this performance level, the bandwidth of the phase-locked loop 220 can be set above 100 kHz, to achieve settling times on the order of single microseconds.

Alternatives

Having described one embodiment, numerous alternative embodiments or variations could be made.

The noise-shaping requantizer 228 has been described above as a third order noise shaper. However, this is merely and example. Higher order noise shapers could be used, providing even better performance, but at the expense of increased complexity. Similarly, lower order noise shapers can be used, with correspondingly lower performance and complexity.

As described above, the period accumulator 214 is decremented upon each cycle of the reference clock and incremented when its contents fall below one. This structure can be widely varied, however, by those skilled in the art. For example, the period accumulator can be made to count up—instead of down—by an arbitrary number of bits, and to count down—instead of up—when its contents cross a threshold. The directions of incrementing or decrementing and not significant, as long as the period accumulator is affected in opposite directions by the two actions. In addition, the threshold need not be "1," but can be any number that represents the point at which the period accumulator is to be refreshed. Typically, the period accumulator 214 is a multi-bit register, for example, a 32-bit register. What is referred to as "1" above actually corresponds to a binary number between 0 and $2^{32-1}$. The number "1" is chosen merely for mathematical simplicity. Those skilled in the art know how the actual binary values should be scaled to produce the desired result.

In the description above, the "desired" output clock has the same frequency as the dividend that is input to the divider 210. This is merely an example, however. By varying the amount by which the period accumulator 214 is incremented compared with the amount by which it is decremented, the output clock period can be varied to something different from the "desired period" that is input to the divider 210. The output clock frequency can also be varied by applying frequency gain to the phase-locked loop 220. As those skilled in the art are aware, phase locked loops can be configured to multiply or divide frequency, or to produce an N/M combination of multiplication and division of an input signal. Therefore, invention should not be considered as limited to producing a clock signal with exactly the value input to the divider 210.

It should be understood, therefore, that the particular implementation of the invention disclosed herein could be widely varied by those skilled in the art within the scope of the invention. Therefore, the invention should be limited only by the spirit and scope of the appended claims.

What is claimed is:

1. A method of producing a desired waveform having a desired period, comprising:

generating a time-quantized signal having a period that is substantially equal to the desired period to within a quantization error;

determining, on a cycle by cycle basis of the desired waveform, a residue signal indicative of the quantization error;

noise shaping the residue signal to generate at least one noise-shaped signal; and selectively delaying each cycle of the time-quantized signal by an interval determined in response to the at least one noise-shaped signal.

2. The method as recited in claim 1, wherein the time-quantized signal is produced in response to a reference clock, and each cycle of the time-quantized signal has a period that substantially equals an integer number of periods of the reference clock.

3. The method as recited in claim 1, wherein the step of noise shaping includes redistributing jitter in the time-quantized signal from relatively lower frequencies to relatively higher frequencies.

4. The method as recited in claim 1, wherein the step of selectively delaying produces a delayed time-quantized signal, and further comprising a step of removing jitter from the delayed time-quantized signal.

5. The method as recited in claim 4, wherein the step of removing jitter includes passing the delayed time-quantized signal through a phase-locked loop.

6. The method as recited in claim 5, wherein the phase-locked loop has a cut-off frequency that is lower than frequencies at which the delayed time-quantized signal includes substantial jitter.

7. The method as recited in claim 6, wherein the phase-locked loop generates an output signal and includes a phase detector that generates an output signal, the method further comprising:

alternatively sampling and holding the output signal of the phase detector, wherein the holding step occurs at a consistent phase relative to each cycle of the output signal of the phase-locked loop.

8. The method as recited in claim 2, wherein the step of generating the time-quantized signal comprises:

incrementing a register in a first direction, in response to each period of the reference clock;

detecting when the contents of the register cross a predetermined threshold in the first direction; and incrementing the contents of the register in a second direction, opposite the first direction, responsive to the detecting step.

9. The method as recited in claim 8, wherein the step of incrementing in the second direction increments the register by an amount equal to the desired period divided by the reference clock period.

10. The method as recited in claim 1, wherein the step of selectively delaying includes delaying the time-quantized signal by an integer number of reference clock periods.

11. A clock generator, comprising:

a period quantizer that generates a time-quantized signal in response to a reference clock;

a noise-shaping requantizer coupled to the period quantizer and generating noise-shaping signals in response to quantization errors of the time-quantized signal; and a variable pipeline delay coupled to the period quantizer and the noise-shaping requantizer, the variable pipeline delay selectively delaying cycles of the time-quantized signal in response to the noise-shaping signals.

12. The clock generator as recited in claim 11, further comprising a phase-locked loop, coupled to the variable pipeline delay and receiving the selectively delayed cycles of the time-quantized signal.

13. The clock generator as recited in claim 11, wherein the phase-locked loop has a cut-off frequency that is lower than frequencies at which the delayed cycles of the time-quantized signal has substantial jitter.

14. The clock generator as recited in claim 11, wherein the phase-locked loop includes a sample-and-hold coupled to the output of a phase detector.

15. The clock generator as recited in claim 14, wherein the sample and hold is constructed and arranged to assume a hold state responsive to a predetermined phase of the desired signal.

16. The clock generator as recited in claim 11, wherein the period quantizer comprises:

a period accumulator clocked by the reference clock being incrementing in a first direction upon each cycle of the reference clock;

an underflow detector coupled to the period accumulator and generating an underflow signal responsive to a value of the period accumulator crossing a predetermined level in the first direction.

17. A clock generator, comprising:

quantizing means for generating a time-quantized signal in response to a reference clock;

noise-shaping means, coupled to the quantizing means, for generating noise-shaping signals in response to quantization errors of the time-quantized signal; and delay means coupled to the quantizing means and the noise-shaping means, for selectively delaying cycles of the time-quantized signal in response to the noise-shaping signals.

18. The clock generator as recited in claim 17, wherein the quantizing means comprises:

period accumulating means for incrementing a value in a first direction in response to each cycle of the reference clock;

underflow means for detecting when the value of the period accumulating means crosses a predetermined level; and means for incrementing the value of the period accumulating means in a second direction opposite the first direction, responsive to a detection by the underflow means.

19. The clock generator as recited in claim 17, wherein the delay means delays each cycle of the time-quantized signal an integer number of reference clock cycles.

20. The clock generator as recited in claim 19, wherein the noise-shaping signals determine the number of reference clock cycles by which each cycle of the time-quantized signal is delayed.

* * * * *